United States Patent [19]

Ribner et al.

[11] Patent Number: 5,754,131
[45] Date of Patent: May 19, 1998

[54] LOW POWER DELTA SIGMA CONVERTER

[75] Inventors: David Byrd Ribner, Andover, Mass.; Juha Mikko Hakkarainen, Coconut Grove, Fla.; David Henry Kenneth Hoe, Schenectady, N.Y.

[73] Assignee: General Electric Company, Schenectady, N.Y.

[21] Appl. No.: 673,543

[22] Filed: Jul. 1, 1996

[51] Int. Cl.$^6$ ................................................. H03M 3/00
[52] U.S. Cl. ........................................... 341/143; 341/118
[58] Field of Search ........................... 341/143, 144, 341/155, 118

[56] References Cited

U.S. PATENT DOCUMENTS

| | | |
|---|---|---|
| 5,065,157 | 11/1991 | Ribner et al. . |
| 5,103,229 | 4/1992 | Ribner . |
| 5,142,286 | 8/1992 | Ribner et al. . |
| 5,148,166 | 9/1992 | Ribner . |
| 5,181,032 | 1/1993 | Ribner . |
| 5,187,482 | 2/1993 | Tiemann et al. . |
| 5,223,753 | 6/1993 | Lee et al. ................... 307/494 |
| 5,283,578 | 2/1994 | Ribner et al. . |
| 5,392,039 | 2/1995 | Thurston ................... 341/143 |

*Primary Examiner*—Jeffrey A. Gaffin
*Assistant Examiner*—Jason L. W. Kost
*Attorney, Agent, or Firm*—Marvin Snyder

[57] ABSTRACT

A delta sigma modulator that has a low power dissipation without sacrificing modulator resolution includes, in one embodiment, a current mode digital to analog converter (DAC) in shunt with a conventional op amp in the first stage of the delta sigma modulator. By adding the current mode DAC in shunt with the first (or only) stage op amp of the delta sigma modulator, the slewing current needed during transients is provided by the combination of the op amp and DAC output signals. Since the DAC provides the slewing current required for the output signal change, the op amp need not apply the slewing current and therefore need only operate at low quiescent power.

15 Claims, 2 Drawing Sheets

LOW POWER DELTA SIGMA CONVERTER

The U.S. Government has a paid-up license in this invention and the right in limited circumstances to require the patent owner to license others on reasonable terms as provided for by the terms of Contract No.: N66001-93-C-0077 awarded by the U.S. Navy.

FIELD OF THE INVENTION

This invention relates generally to delta sigma (Δ-Σ) analog-to-digital (A/D) converters and, more particularly, to delta sigma converters having low power dissipation.

BACKGROUND OF THE INVENTION

High resolution analog-to-digital (A/D) signal conversion can be achieved with lower resolution components through the use of over sampled interpolative (or delta sigma) modulation followed by digital low pass filtering and decimation. Oversampling refers to operation of the modulator at a rate many times greater than the Nyquist rate. Decimation refers to decreasing the sample rate of the signal by appropriate filtering and resampling.

Delta sigma modulators (sometimes referred to as sigma delta modulators) have been used in A/D converters for some time. In general, a delta sigma A/D converter uses an internal A/D converter of modest resolution and a complementary digital-to-analog (D/A) converter in a feedback loop. The feedback loop increases the accuracy of the A/D converter in a manner consistent with the high speed operation afforded by the internal A/D converter.

In known delta sigma A/D converters, resolution is predominantly governed by three factors: the ratio of the modulator clock to the Nyquist rate (typically referred to as the oversampling ratio), the "order" of the modulator, and the number of quantizer bits used in the delta sigma modulator. "Order" in this context is analogous to the order of a frequency selective filter and indicates the relative degree of spectral shaping that is provided by the modulator. A "high order" analog-to-digital converter is a third or higher order network.

Typically, in a high order oversampled delta sigma modulator, the first integrator stage noise is dominant. Therefore, the first stage integrator is typically operated at higher power than the other modulator integrators to achieve a low noise level. In a switched capacitor integrator implementation, for example, the first stage integrator has larger capacitors and a corresponding large operational amplifier ("op amp") to achieve a suitably low overall noise performance. Higher current levels in the op amp are needed to charge and discharge the larger capacitors. Use of such high current levels results in high power dissipation.

Generally, and at least for the first stage integrator and in modulators that operate at high clock rates, i.e. 1 MHz and above, Class-A type op amps are used to satisfy the settling requirements of the switched capacitor integrators. Class-A type op amps have a quiescent current $I_O$ higher than the largest slewing current delivered to the op amp capacitive load. Although the op amp only slews a fraction of the time, it draws the high quiescent current continuously resulting in high power dissipation.

It would be desirable to provide a delta sigma modulator which has a lower power dissipation than known modulators that utilize Class-A type op amps. In addition, it would be desirable to achieve such low power dissipation and yet maintain the modulator resolution.

SUMMARY OF THE INVENTION

By using a current mode digital to analog converter (DAC) in shunt with the first (or only) stage of a conventional op amp in the first stage of a delta sigma modulator, the slewing current needed during transients is provided by the combination of the op amp and DAC output signals. Since the DAC provides the slewing current required for the change in output signals, the op amp need not apply the slewing current. Therefore, the op amp need only operate at a low quiescent power.

The modulator described above exhibits lower power dissipation than known modulators which utilize Class-A type op amps. In addition, the modulator achieves such low power dissipation while maintaining the modulator resolution.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION

The resolution of delta sigma converters is given by the relationship:

$$\text{Bits} = (L + 1/2)\log_2 R - \log_2 \left[ \frac{\pi^L}{\sqrt{2L+1}} \right] + \log_2(2^Q - 1) \qquad (1)$$

where "Bits" is the number of bits produced by the converter, "R" is the modulator oversampling ratio, "L" is the order of the modulator and "Q" is the number of quantizer bits used in the modulator. Resolution therefore is predominantly governed by three factors; specifically, by the oversampling ratio R, the "order" L of the modulator, and the number Q of quantizer bits.

Order in this context is analogous to the order of a frequency selective filter and indicates the relative degree of spectral shaping that is provided by the modulator. A "high order" analog-to-digital converter is a third or higher order network.

Figure 1:
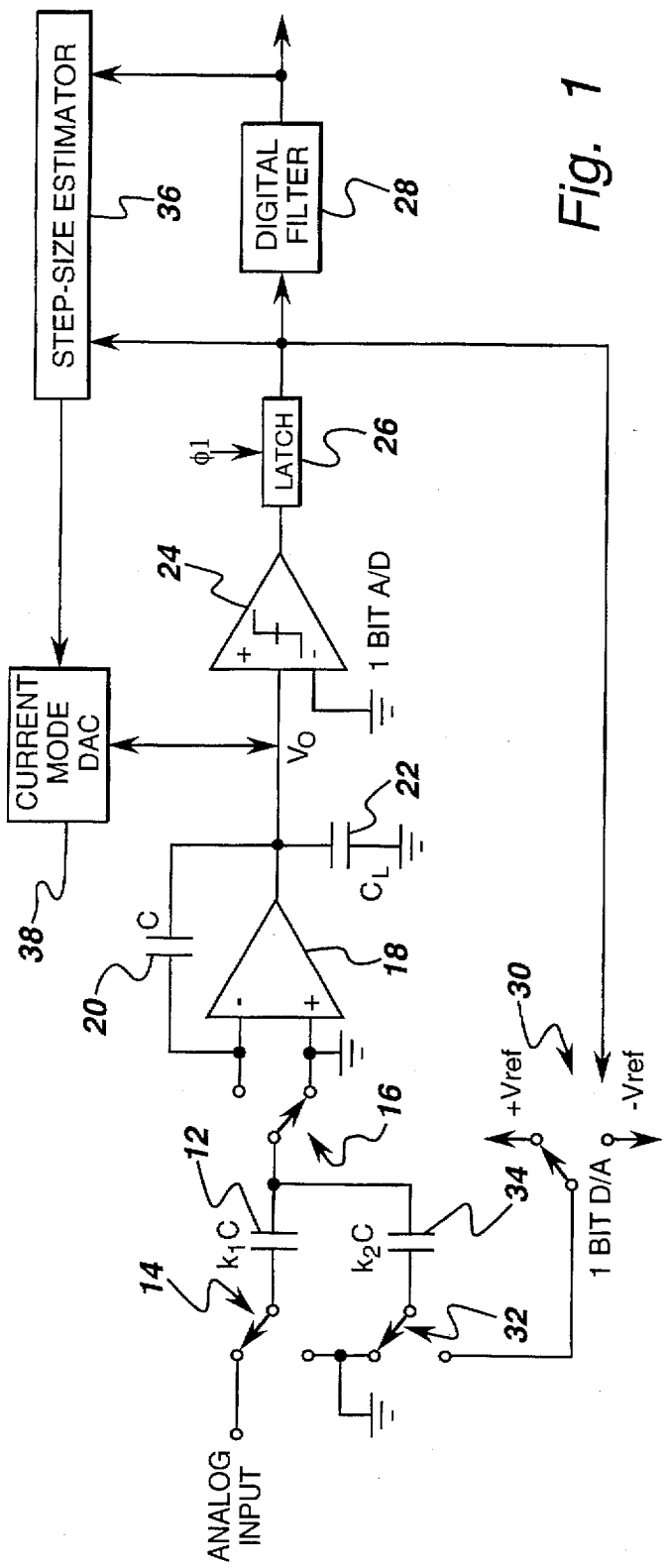
FIG. 1 is a part schematic and part block diagram of a first order delta sigma modulator in accordance with one embodiment of the invention.

A first order delta sigma modulator 10 which has a lower power dissipation than known modulators that utilize Class-A type op amps is shown in schematic form in FIG. 1. Although modulator 10 is shown in first order form, it could be expanded to include additional integrators, or stages, as is well known, to provide a higher order modulator. The first order construction is illustrated and described herein by way of example only.

Modulator 10 includes a first scaling capacitor 12 coupled to a first switch 14 for sampling an analog input signal, which is typically sinusoidal. The output of capacitor 12 is selectively coupled, via the single pole of a second switch 16, to the negative input of an op amp 18 and ground. A feedback capacitor 20 is coupled between the output and negative input of op amp 18. A load capacitor 22 is coupled between the output of op amp 18 and ground.

The output of op amp 18 is also coupled to a one-bit analog-digital converter 24, illustrated as a comparator. The output of converter 24 is coupled to the input of a single phase triggered latch 26, and the output of latch 26 is coupled to a low pass digital filter 28. The output of latch 26 is also fed back to a one-bit digital-to-analog converter 30, illustrated as a third switch operable between $+V_{ref}$ and $-V_{ref}$ reference voltages, as is well known in the art. The output signal from converter 30 is applied, through a fourth switch 32, to a second scaling capacitor 34 which is coupled to the single pole of switch 16 and provides a feedback signal to op amp 18.

The input and output of digital filter 28 are coupled to a step-size estimator 36, and the output signal of estimator 36 is used to control a current mode digital-to-analog converter 38. Converter 38 also is coupled to the output of op-amp 18 and, as described hereinafter in more detail, adds or draws charge q therefrom.

In operation, the switching rate or frequency of first switch 16 controls the sample rate at which the analog input signal is sampled, as is well known in the art. The analog input signal is sampled by capacitor 12 and, under control of second switch 16, op amp 18 generates, as an output signal, an integrated version of the scaled, sampled analog input signal. Op amp 18 develops output voltage $V_O$ across load capacitor 22, and voltage $V_O$ produced by op amp 18 is supplied as an input signal to one-bit analog-to-digital converter 24. The digital output signals from converter 24 are supplied to phase controlled latch 26, which provides a digital output signal to digital filter 28. The digital signal from latch 26 is also fed back, via digital-to-analog converter 30, third switch 32, and second scaling capacitor 34, to the input of integrator 18. Operation of first, second and third switches 14, 16 and 32, integrator 18, converter 24, latch 26 and filter 28 are well known in the art.

In the past, however, integrator 18 was typically implemented using a Class-A type op amp, which has a high quiescent current $I_Q$. Although op amp 18 only slews a fraction of the time, op amp 18 continuously draws the high quiescent current which results in high power dissipation.

Such high power dissipation is reduced, however, by using, for op amp 18, a low power dissipation type op amp, e.g., a Class-B type op amp, and operating step-size estimator 36 and current mode digital-to-analog converter 38 as described below to provide the necessary current-to-noise ratio to provide sufficient resolution. More specifically, the change of output voltage $V_O$ from op amp 18 can be expressed as:

$$\Delta V_O = k_1 V_{in} - k_2 V_{DAC}, \quad (2)$$

where $k_1$ and $k_2$ are scaling factors for capacitors 12 and 32, respectively, $V_{in}$ is the voltage level of the analog input signal, and $V_{DAC}$ is the voltage across digital-to-analog converter 30. Further, since op amp 18 is implemented as a low power dissipation type op amp, the charge q, necessary to be added or removed from output voltage $V_O$, can be expressed as:

$$q = (C + C_L) \Delta V_0. \quad (3)$$

Adding charge q to output voltage $V_O$ of low power op amp 18 enables generation of the desired settling characteristics even though op amp 18 itself produces a lower charge than desired.

In accordance with one embodiment of the present invention, charge q is supplied or removed, depending upon the value of $\Delta V_O$, by current mode DAC 38 operated for a specified interval during each input signal sampling cycle. Specifically, by comparing the input and output signals of digital filter 28, digital step size estimator 36 estimates the amount of charge q needed to slew output voltage $V_O$ in order to be close to its updated level. Such estimation is performed by estimator 36 using the input and output signals of filter 28 to estimate voltages $V_{in}$ and $V_{DAC}$. With such estimated values, and since $k_1$ and $k_2$ are known, an estimated value for $\Delta V_O$ is generated in estimator 36 according to equation (2). Once $\Delta V_O$ has been estimated, and since C and $C_L$, the values of capacitors 12 or 14, and 22, respectively, are known, an estimated value of q can also be generated by estimator 36 according to equation (3).

Once an estimated charge q has been determined by estimator 36, estimator 36 controls current mode DAC 38 to either add a charge or remove a charge, depending upon the value of q, from output voltage $V_O$. Current mode DAC 38 is controlled by estimator 36 so that DAC 38 draws current only during the slewing interval.

By using current mode DAC 38, op amp 18 is not required to provide the slewing current for output voltage $V_O$ to change. Op amp 18 is used, however, to drive output voltage $V_O$ to the final value since charge q provided by DAC 38 is only an estimate of the charge actually required, due to the limited number of bits provided by converter 30 and the fact that the value of the analog input voltage $V_{in}$ is estimated by estimator 36.

Figure 2:
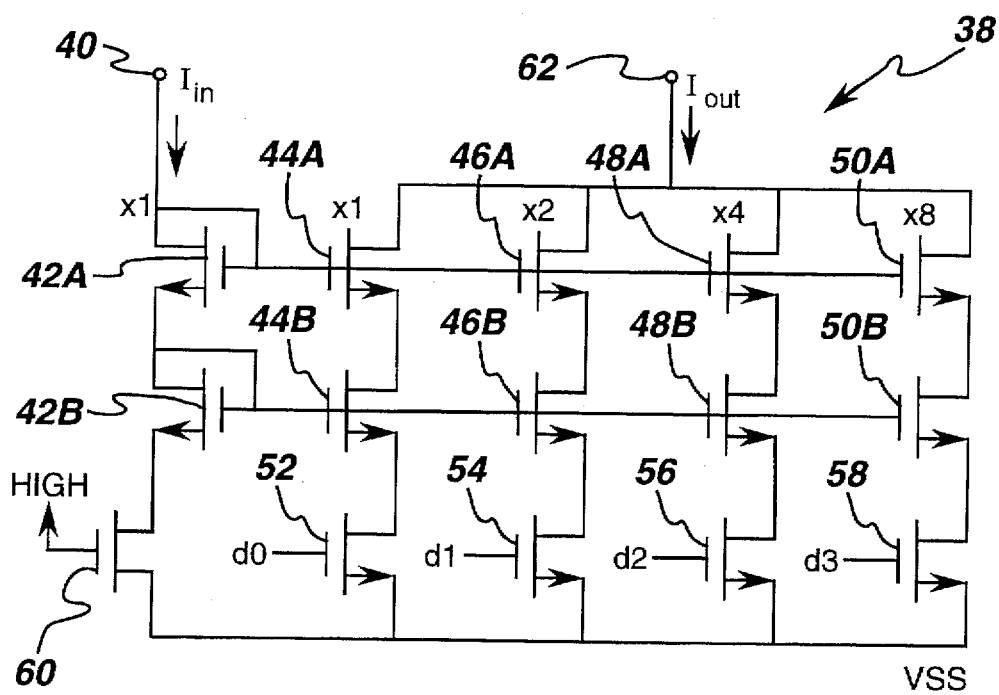
FIG. 2 is a circuit diagram of one embodiment of a current mode digital-to-analog converter that may be used in the converter illustrated in FIG. 1.

One embodiment of current-mode DAC 38 for removing charge q from op amp 18 output voltage $V_O$ is shown in circuit schematic form in FIG. 2. To add charge q to output voltage $V_O$, a complementary current mode DAC (not shown) having p-channel FETs (field effect transistors) is used. Specifically, the p-channel FETs are used to inject charge q into output voltage $V_O$. Such p-channel FETs are controlled by step-size estimator 36 in the same manner is the n-channel FETs shown in FIG. 2.

As shown in FIG. 2, DAC 38 includes an input 40 coupled to receive an input current $I_{in}$, which is a bias current supplied by a biasing circuit (not shown) to properly bias the transistors of DAC 38. A switched current mirror, which includes coupled n-channel FETs. 42A-B, 44A-B, 46A-B, 48A-B and 50A-B, is controlled by digitally controlled FET switches 52, 54, 56 and 58. FET 60 is coupled high to match the impedance of switches 52, 54, 56 and 58. A current $I_{out}$ is drawn at an output terminal 62 of DAC 38. Current $I_{out}$ is the current resulting from charge q drawn from the output of op amp 18 (FIG. 1).

Operation of switched current mirrors, such as those comprising DAC 38, is well known. Specifically, current scaling is performed by selectively enabling, using digital inputs d0, d1, d2 and d3 of FETs 52, 54, 56, and 58, respectively, to increase input current $I_{in}$ magnitude by one time (X1), two times (X2), four times (X4), eight times (X8), or some combination thereof between one time (X1), i.e., only input d0 is high, and fifteen times (X15), i.e., inputs d0, d1, d2 and d3 are all high.

By implementing and using step-size estimator 36 and current mode DAC 38 as described above, the potential power savings are significant. Op amp 18 can be implemented using a Class-A type op amp, with a smaller quiescent current, or as a Class-B type op amp, for example. In any event, op amp 18 only needs to have a sufficient bias current to provide the bandwidth for the transient involved in the final settling process.

For a high-order modulator greater than first order modulator 10 illustrated in FIG. 1, step size estimator 36 and current mode DAC 38 would be used in connection with only the first stage integrator since all successive stages would operate at significantly lower power levels. By adding current mode DAC 38 in shunt with the first (or only) stage op amp, the slewing current needed during transients is provided.

Figure 3:
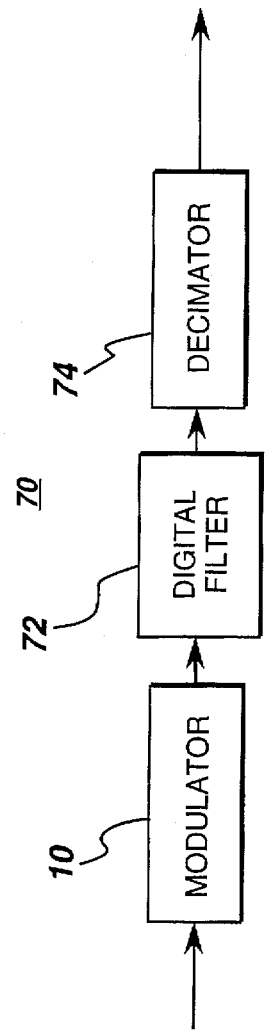
FIG. 3 is a block diagram of the first order delta sigma modulator of FIG. 1 incorporated into a delta sigma analog-to-digital converter.

FIG. 3 illustrates modulator 10 of FIG. 1 incorporated into a delta-sigma analog-to-digital converter 70. A digital filter 72 performs low pass filtering on the modulator output signal. The filtered modulated output signal is decimated by a decimator 74 to produce an output signal for analog-to-digital converter 70 at a decreased sample rate.

While only certain preferred features of the invention have been illustrated and described, many modifications and changes will occur to those skilled in the art. For example, a low resolution analog-to-digital converter can be used to provide a coarse estimate of voltage $V_{in}$ rather than using digital filter 28. It is, therefore, to be understood that the appended claims are intended to cover all such modifications and changes as fall within the true spirit of the invention.

What is claimed is:

1. A delta sigma analog-to-digital converter comprising:

an oversampled interpolative modulator for receiving an input analog signal to be converted and generating an output digital signal;

a digital filter coupled to receive the output digital signal of said oversampled interpolative modulator for generating a filtered digital output signal; and a decimator coupled to receive the filtered digital output signal of said digital filter for reducing the sampling rate of said filtered digital output signal, said oversampled interpolative modulator comprising:

at least a first integrator coupled to receive samples of the input analog signal and for generating an integrated analog output signal $V_O$;

an analog-to-digital converter coupled to receive the output signal of said first integrator;

a digital-to-analog converter coupled to receive the output signal of said analog-to-digital converter, an output of said digital-to-analog converter being coupled to the input of said first integrator;

a step-size estimator coupled to the output of said analog-to-digital converter for estimating a voltage $\Delta V_O$; and a current mode digital-to-analog converter controlled by the output of said step-size estimator and coupled between the output of said first integrator and the input of said analog-to-digital converter.

2. The delta sigma analog to digital converter of claim 1 wherein said first integrator comprises an op amp having a low quiescent current.

3. The delta sigma analog to digital converter of claim 2 further comprising a load capacitor coupled between the output of said op amp and ground.

4. The delta sigma analog to digital converter of claim 3 including a feedback capacitor coupled between the output and input of said first integrator, and wherein said current mode digital-to-analog converter is configured to supply a charge q equal to:

$$q=(C+C_L)\Delta V_0$$

where C equals the capacitance of said feedback capacitor and $C_L$ equals the capacitance of said load capacitor.

5. The delta sigma analog to digital converter of claim 2 wherein said op amp comprises a Class-B type op amp.

6. The delta sigma analog to digital converter recited in claim 1 further comprising a digital filter coupled to the output of said analog-to-digital converter, said step-size estimator being coupled to receive input signals from both the input of said digital filter and the output of said digital filter.

7. The delta sigma analog to digital converter of claim 6 further comprising a latch coupled to the output of said analog-to-digital converter, the output of said latch being coupled to the input of said digital filter.

8. The delta sigma analog to digital converter of claim 1 wherein said current mode digital-to-analog converter comprises a plurality of field effect transistors configured to form a digitally controlled switched current mirror.

9. An oversampled interpolative modulator for receiving an input analog signal and generating an output digital signal, said modulator comprising:

at least a first integrator coupled to receive samples of the input analog signal and for generating an integrated analog output signal $V_O$;

an analog-to-digital converter coupled to receive the output signal of said first integrator;

a digital-to-analog converter coupled to receive the output signal of said analog-to-digital converter, an output of said digital-to analog converter being coupled to the input of said first integrator;

a step-size estimator coupled to the output of said analog-to-digital converter for estimating a voltage $\Delta V_0$ required to be added to output signal $V_O$; and a current mode digital-to-analog converter controlled by said step-size estimator and coupled between the output of said first integrator and the input of said analog-to-digital converter.

10. The oversampled interpolative modulator of claim 9 wherein said first integrator comprises an op amp having a low quiescent current.

11. The oversampled interpolative modulator of claim 10 wherein said op amp comprises a Class-B type op amp.

12. The oversampled interpolative modulator of claim 10 further comprising a load capacitor coupled between the output of said op amp and ground.

13. The oversampled interpolative modulator of claim 9 further comprising a digital filter coupled to the output of said analog-to-digital converter, said step-size estimator being coupled to receive input signals from both the input of said digital filter and the output of said digital filter.

14. The oversampled interpolative modulator of claim 13 further comprising a latch coupled between the output of said analog-to-digital converter and the input of said digital filter.

15. The oversampled interpolative modulator of claim 9 wherein said current mode digital-to-analog converter comprises a plurality of field effect transistors configured to form a switched current mirror, said current mirror being adapted to be controlled digitally by field effect transistor switches.

* * * * *